US 6,657,523 B2

(12) United States Patent
Tarui et al.

(10) Patent No.: US 6,657,523 B2
(45) Date of Patent: Dec. 2, 2003

(54) STACKED RADIO-FREQUENCY MODULE

(75) Inventors: Yukinobu Tarui, Tokyo (JP); Kazuhiro Yamaguchi, Tokyo (JP); Jun Mitani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/153,651

(22) Filed: May 24, 2002

(65) Prior Publication Data
US 2003/0122638 A1 Jul. 3, 2003

(30) Foreign Application Priority Data

Dec. 27, 2001 (JP) ........................................ 2001-398059

(51) Int. Cl.[7] ................................................. H01P 3/08
(52) U.S. Cl. .................... 333/246; 333/33; 333/204; 333/247; 333/238; 333/160; 361/761; 361/764; 361/780
(58) Field of Search ................................. 333/246, 247, 333/238, 33, 204, 160; 361/761, 764, 780

(56) References Cited

U.S. PATENT DOCUMENTS

| | | | | |
|---|---|---|---|---|
| 5,023,624 A | * | 6/1991 | Heckaman et al. | ......... 343/860 |
| 5,065,124 A | * | 11/1991 | Chrzan | ........................ 333/246 |
| 5,132,648 A | * | 7/1992 | Trinh et al. | ................... 333/128 |
| 5,136,271 A | | 8/1992 | Nishioka et al. | |
| 5,389,904 A | * | 2/1995 | Tao et al. | ...................... 333/246 |
| 6,057,600 A | * | 5/2000 | Kitazawa et al. | ............ 257/728 |
| 6,215,377 B1 | * | 4/2001 | Douriet | ........................ 333/247 |
| 6,333,856 B1 | * | 12/2001 | Harju | ........................... 361/761 |
| 6,356,173 B1 | * | 3/2002 | Nagata et al. | ............... 333/247 |

OTHER PUBLICATIONS

Hazime Kawano, Radio-frequency Circuit Module, Unpublished U.S. patent application No. 09/605,639, Filed Jun. 28, 2000.

* cited by examiner

Primary Examiner—Michael Tokar
Assistant Examiner—Linh Van Nguyen
(74) Attorney, Agent, or Firm—Burns, Doane, Swecker & Mathis, LLP

(57) ABSTRACT

A stacked radio-frequency module is formed by stacking packages each storing MMICs and mounting another package upside down which stores a control circuit for controlling MMICs. The MMICs and control circuits are each sealed by a metal sealing lid within the cavity of each of the packages which are spatially completely separated from each other. Each of the pads for wiring paths for radio-frequency signals and for power supply/control signals and ground pads are provided within each package and at opposing surfaces of packages to be stacked with corresponding pads joined by a gold bump.

8 Claims, 9 Drawing Sheets

STACKED RADIO-FREQUENCY MODULE

BACKGROUND OF THE INVENTION

1. Field of the Invention

The present invention relates to a stacked radio-frequency module, and in particular, to improvements in the structure of a stacked radio-frequency module mounted in communications equipment such as radar or the like.

2. Description of the Related Art

FIGS. 13 and 14 are respectively a top view and a side cross sectional view of a conventional radio-frequency module. In FIG. 13, hatchings are drawn in certain sections in order to facilitate identification of each element. In FIG. 14, on the other hand, hatchings are not drawn in the cross sections for easier view. FIGS. 13 and 14 show a dielectric substrate 20, input/output pads 2 for radio-frequency signals (hereinafter referred to as "RF pads"), input/output pads 4 for power supply/control signals (hereinafter referred to as "DC/CONT pads"), via holes 7 within the dielectric substrate 20, strip wiring paths 8 for radio-frequency signals (hereinafter referred to as "strip wiring paths"), active microwave circuits 9 (hereinafter referred to as "MMIC"s (Monolithic Microwave Integrated Circuit)), wiring paths 10 for control signals, and a metal sealing lid 12. The multilayer substrate 20 has a structure scraped inside such that the MMICs 9 can be stored inside, and forms a cavity structure along with the metal sealing lid 12. FIGS. 13 and 14 further show ground potential surfaces 11 of the module, bonding wires 13 (hereinafter referred to as "wires"), wire bonding surfaces 16 for radio-frequency signals and for power supply/control signals, and a mounting surface 17 for the metal sealing lid 12.

Next, the operation of such a conventional radio-frequency module will be explained. A radio-frequency signal input from the strip wiring path 8a is connected via a bonding wire 13a to an RF pad 2a and is transmitted to an MMIC 9a. The radio-frequency signal is then subjected to signal modulation by the MMIC 9a, such as, for example, amplification, attenuation, and phase shift of the signal, and transmitted to an MMIC 9b through an RF pad 2b, a wire 13b, and an RF pad 2c. The radio-frequency signal is then subjected to a signal modulation in the MMIC 9b similar to that in the MMIC 9a. The radio-frequency signal is further supplied to an MMIC 9c through an RF pad 2d, a wire 13c, a strip wiring path 8b, a wire 13d, and an RF pad 2e, and is modulated at the MMIC 9c. After this process, the radio-frequency signal is transmitted through an RF pad 2f, a wire 13e, and an RF pad 2g to an MMIC 9d, and is modulated at the MMIC 9d. Finally, the radio-frequency signal is output outside the module through an RF pad 2h, a wire 13f, and a strip wiring path 8c.

Power supply/control signals input from a plurality of DC/CONT pads 4a, on the other hand, are transmitted through respective wiring paths 10a, 10b, 10c, and 10d for control signals which passes through the dielectric substrate 20, and wires 13g, 13h, 13i and 13j, to DC/CONT pads 4b, 4c, 4d, and 4e, to operate the MMICs 9a, 9b, 9c, and 9d. The ground potential surfaces 11 are grounded by a plurality of via holes 7, to set the ground potentials for the MMICs 9a 9d.

Here, the MMICs 9a and 9b and MMICs 9c and 9d are respectively stored within two cavities formed by the dielectric substrate 20 and electromagnetically shielded by the metal sealing lid 12. To prevent erroneous operations due to signal interference, the MMICs 9a and 9b and the MMICs 9c and 9d are separated spatially and according to radio frequencies.

However, with such conventional radio-frequency module, there is a problem in that increase in the module size cannot be avoided because of the number and size of the MMICs 9 necessary for the function of the module. In recent years, there is a tendency for the module size to increase because of the higher demands for more functions in a module. On the other hand, there is a conflicting desire that the size of the radio-frequency module be reduced in order to respond to the increasing demand for reduction of module size to allow the use of signals having higher frequency, and increasing demands for reduction of the size of wireless devices.

A conventional stacked module which has been proposed in order to reduce the above described problems associated with the increased number of functions and size reduction will now be explained. FIG. 15 is a cross sectional view of this improved stacked module and FIG. 16 is a cross sectional enlarged view of a stacked bump section. In both FIGS. 15 and 16, the hatchings indicating the cross section are omitted for the sake of clarity. FIGS. 15 and 16 show stacked bumps 23, strip wiring paths 8, active semiconductor chips 9, dielectric substrates 20, an exposed section 21 of the strip wiring path, and a package 22. In this conventional example, a stacked module having a three-stage structure, in which three dielectric substrates 20a, 20b, and 20c are stacked, is shown. The dielectric substrates 20a, 20b, and 20c are collectively and air-tightly sealed by the package 22.

Next, the operations in this conventional example will be described. A strip wiring path 8a provided on the dielectric substrate 20a is connected, via stacked bumps 23, to a strip wiring path 8b provided on the dielectric substrate 20b at one stage above the dielectric substrate 20a. A strip wiring path exposure section 21 is formed on the strip wiring path 8b in which the dielectric substrate 20b is removed from the portion corresponding to the portion of the strip wiring path 8b to which the bumps 23 are to be connected. With such a structure, it is possible to connect the signal lines for the dielectric substrates 20a and 20b. Three dielectric multiple-layer substrates are stacked in the conventional stacked module, so that the stacked module has advantages that the mounting area for the module is extensively reduced, and, consequently, that the module size can be reduced.

However, because such a stacked module are developed for packages for storing active elements having relatively low operation frequency, such as a memory, the following problems are present when such a stacked module is employed as a radio-frequency module.

First, although the signal lines of the dielectric substrates are connected by stacked bumps, connection for ground signals, which is the counterpart to the signal lines, are not present between the stages, and, therefore, it cannot be assured that the radio-frequency signals will be reliably transmitted.

Second, because the clearance between the MMIC and the dielectric substrate at one stage above are determined only by the height of the stacked bumps, it has been difficult to secure sufficient clearance for mounting radio-frequency circuits. Because of this, the operation of the MMIC is influenced by the dielectric substrate at one stage above, and therefore, there is a problem in that desired characteristics may sometimes not obtained.

Also, because the shielding of the radio-frequency signals propagating through each stage is not sufficiently considered, the isolations between the stages are not sufficient. Because of this, there is a problem in that the signals to be transmitted may sometime interfere with each other, and smooth, reliable operation cannot be obtained.

Moreover, in order to connect the strip wiring path at the upper stage and the bumps, there is a need to expose the wiring path by precisely removing a portion in the dielectric substrate. Consequently, there is a problem in that a high-level manufacturing process is required and the cost is increased.

SUMMARY OF THE INVENTION

The present invention was conceived to solve the problems in the related art and one object of the present invention is to provide an improved stacked radio-frequency module having high functionality, a reduced size, and wider bandwidth.

In order to achieve at least the object mentioned above, according to the present invention, there is provided a stacked radio-frequency module formed by stacking dielectric multi-layer substrates onto which radio-frequency circuits are provided, wherein, at least two of the dielectric multi-layer substrates comprise a substrate having dielectric walls provided on its periphery; a closed space in which the radio-frequency circuits are stored, said closed space formed by being surrounded by the dielectric walls and the dielectric multi-layer substrate provided as an upper stage; an input/output terminal for radio-frequency signals provided on at least one of the upper surfaces of the dielectric walls and the bottom surface of the substrate at a position where the dielectric walls are provided, at a position opposing an input/output terminal for radio-frequency signals of the dielectric multi-layer substrate at the upper stage or lower stage; an input/output terminal for power supply/control signals provided on at least one of the upper surfaces of the dielectric walls and the bottom surface of the substrate at a position where the dielectric walls are provided, at a position opposing an input/output terminal for power supply/control signals of the dielectric multi-layer substrate at the upper stage or lower stage; a transmission path within the substrate for radio-frequency signals provided inside the dielectric multi-layer substrate, for connecting the input/output terminal for radio-frequency signals and the radio-frequency circuits; and a transmission path within the substrate for power supply/control signals provided inside the dielectric multi-layer substrate, for connecting the input/output terminal for power supply/control signals and the radio-frequency circuits, and gold bumps are provided for joining the input/output terminals for radio-frequency signals that are provided at opposing positions and for joining the input/output terminals for power supply/control signals that are provided at opposing positions.

According to another aspect of the present invention, it is preferable that the stacked radio-frequency module further comprises a dielectric multi-layer substrate for storing a control circuit for setting power supply/control signals for the radio frequency circuits.

According to another aspect of the present invention, it is preferable that a sealing lid for sealing the circuits is provided for the closed space.

According to another aspect of the present invention, it is preferable that a large-capacitance capacitor be provided on the bottom surface of the dielectric multi-layer substrate forming the closed space.

According to another aspect of the present invention, it is preferable that at least one of an external input/output terminal for radio-frequency signals and an external input/output terminal for power supply/control signals is provided on a side surface of a dielectric wall of the dielectric multi-layer substrate.

According to another aspect of the present invention, it is preferable that the input/output terminal for radio-frequency signals and the input/output terminal for power supply/control signals are provided on a surface created by partially removing at least one layer which forms the dielectric multi-layer substrate.

According to another aspect of the present invention, it is preferable that an electric wave absorber is provided in the closed space.

With the present invention, because gold bumps having small frequency characteristics are used for transmission paths of signals provided within the dielectric multi-layer substrates, a compact, multi-functional module which can operate at radio-frequency can be assembled. Also, because the joining surfaces by the gold bumps are provided at opposing end surfaces of two dielectric multi-layer substrates, partial substrate machining or the like for signal connection is no longer necessary, resulting in improvements in productivity of each of the packages having each of the dielectric multi-layer substrates. Moreover, a parasitic inductance component caused by the connection can be reduced with the use of the gold bumps. Further, because the structure is such that one vertical feed wiring path penetrates through different dielectric multi-layer substrates, signal transmission between the packages with wide bandwidth and low loss can be realized.

According to the present invention, because the distance between the sealing lid and the radio-frequency circuit can be secured by simply adjusting the height of the dielectric walls provided inside the dielectric multi-layer substrates, radio-frequency circuits can be designed with relative freedom and without large changes in characteristics.

According to the present invention, because the structure is such that the closed space in which radio-frequency circuits are installed is provided for each package so that each of the radio-frequency circuits are spatially completely separated, and, because no electromagnetic bonding or the like is used for signal transmission, it is possible to increase the electrical isolation between the radio-frequency circuits.

According to the present invention, because the control circuit is stored within a package, increase in the module size can be prevented.

According to the present invention, because the structure is such that the electromagnetic shielding is provided by air-tightly sealing the radio-frequency circuits by a sealing lid, it is possible to prevent leakage of radiation signals from the connection between the radio-frequency circuits and bonding wires. In this manner, erroneous operations caused by radiation signals can be prevented.

According to the present invention, because it is possible to provide large-capacitance capacitors within the closed space, it is possible to improve the stability of the radio-frequency circuits at low frequencies in cases where the radio-frequency circuits include an HPA or the like. It is also possible to increase the rise speed of the pulse waveform. Also, because the capacitors can be built into the module, the module can be maintained at a compact size.

According to the present invention, because an external input/output terminal for radio-frequency signals or for power supply/control signals is provided on a side surface of a dielectric wall of dielectric multi-layer substrates, it is possible to secure an area for radiation when a heat generating element such as an HPA is mounted in the lower-most layer, and, at the same time, the lengths of wiring paths propagating through the multi-layer substrates from the external input/output terminal to the radio-frequency circuits, such as the vertical feed line and the strip wiring paths, can be reduced. In this manner, loss involved with signal propagation can be minimized.

According to the present invention, because a portion of the dielectric multi-layer substrate is removed and input/output terminals for the signals are provided on the surface created by such a removal, it is possible to prevent degradation of characteristics due to excessive collapse of gold bumps upon joining of the dielectric multi-layer substrates by the bumps.

According to the present invention, because an electric wave absorber is provided within the closed space, attenuation of the signals leaking from the gold bump for connecting two dielectric multi-layer substrates forming the closed space and propagating through the closed space can be increased. Also, even when two signals transmitting through spatially separated gold bumps have different amplitudes, no unnecessary oscillation is generated, and, thus, the module can be operated without disadvantageous effect.

BRIEF DESCRIPTION OF THE DRAWING(s)

DESCRIPTION OF PREFERRED EMBODIMENTS

Figure 1:
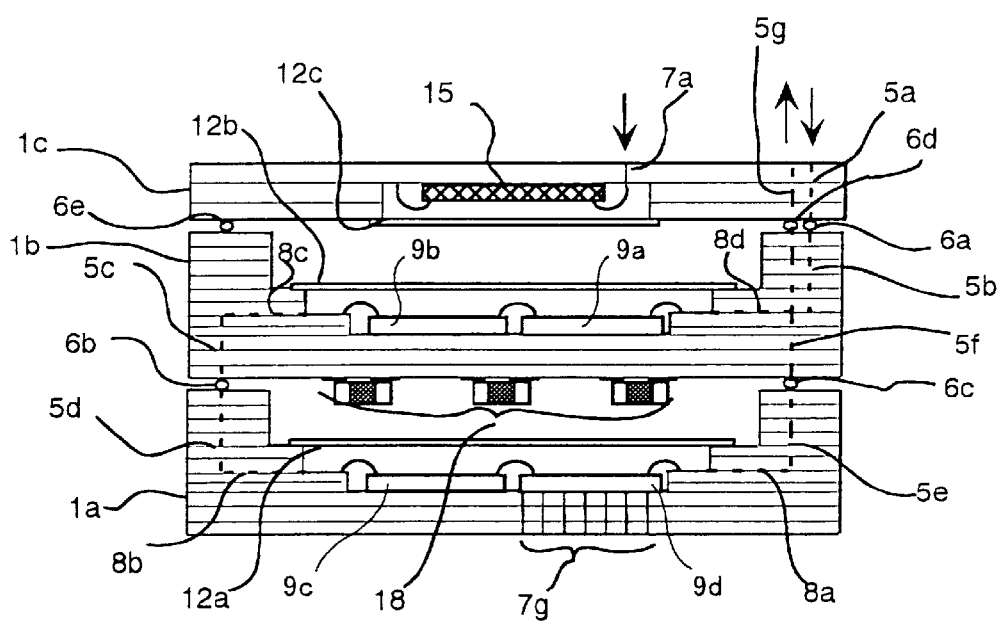
FIG. 1 is a side cross sectional view taken along line A–A' line of FIG. 2, and shows a first embodiment of a stacked radio-frequency module according to the present invention.

The preferred embodiments of the present invention will now be described referring to the drawings. In the drawings, elements identical to those in the related art are assigned the same reference numerals.

Embodiment 1

FIGS. 1 through 8 shows a first embodiment of a stacked radio-frequency module according to the present invention. The first embodiment will be described with an example of a stacked radio-frequency module (hereinafter also referred to as "stacked module") having a three-stage structure. It should be noted, however, that the present invention is not limited to such a three-stage structure.

Figure 2:
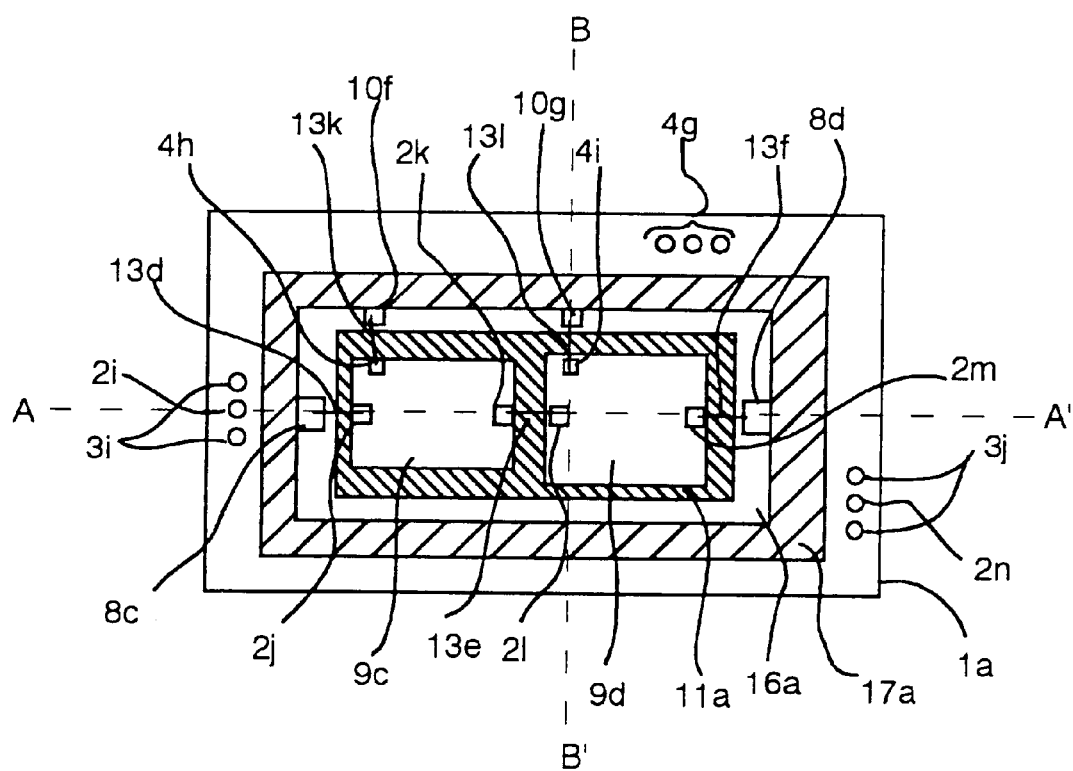
FIG. 2 is a front view of a first dielectric multi-layer substrate according to the first embodiment of the present invention.
Figure 3:
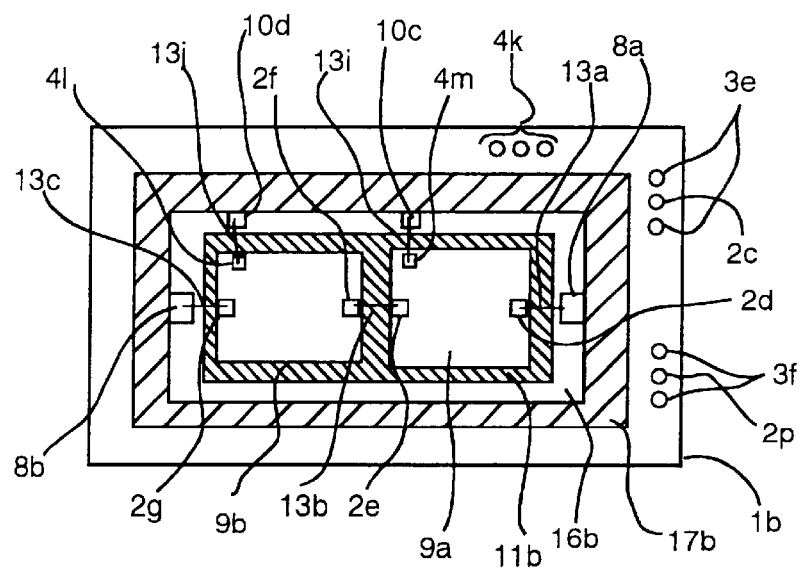
FIG. 3 is a front view of a second dielectric multi-layer substrate according to the first embodiment of the present invention.
Figure 4:
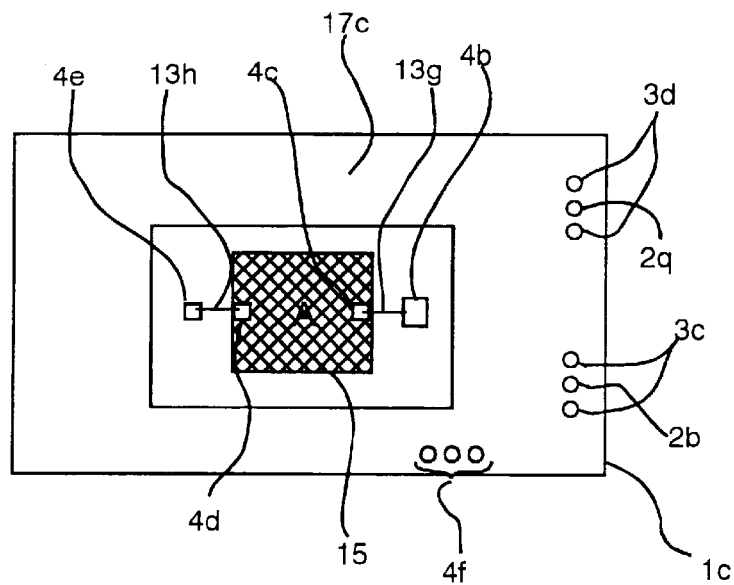
FIG. 4 is a front view of a third dielectric multi-layer substrate according to the first embodiment of the present invention.
Figure 5:
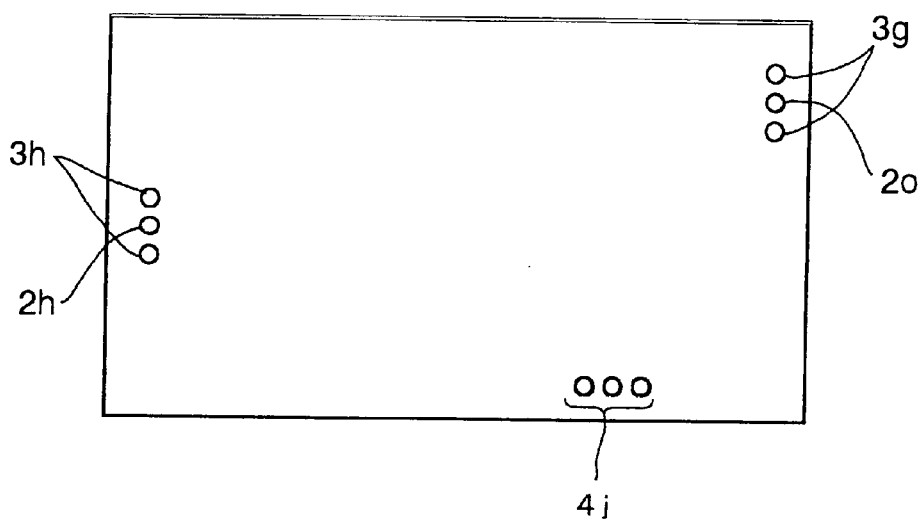
FIG. 5 is a bottom view of the second dielectric multi-layer substrate according to the first embodiment of the present invention.
Figure 6:
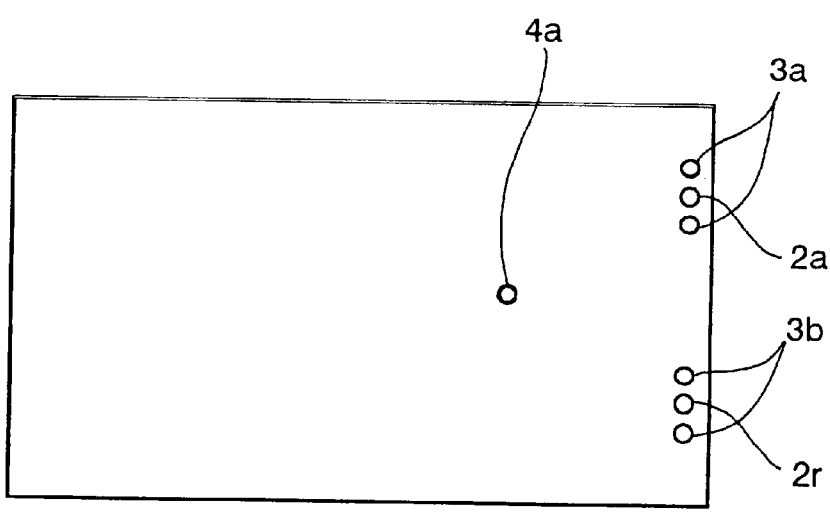
FIG. 6 is a bottom view of the third dielectric multi-layer substrate according to the first embodiment of the present invention.
Figure 7:
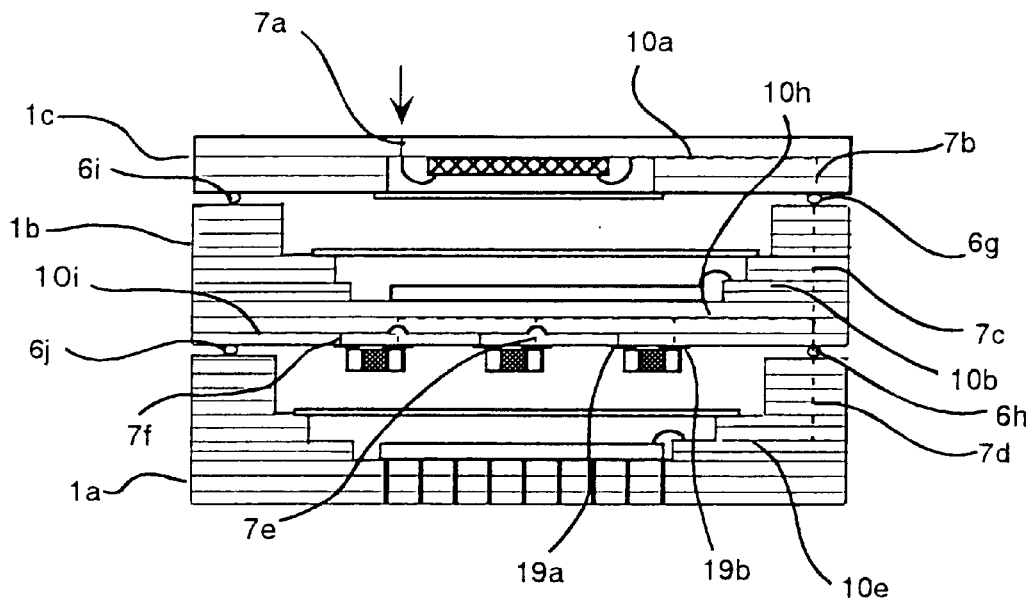
FIG. 7 is a side cross sectional view taken along B–B' line of FIG. 2.
Figure 8:
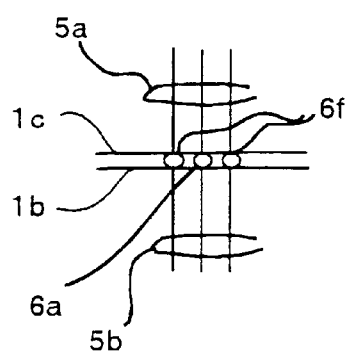
FIG. 8 is an enlarged view showing important sections of vertical feed lines and bump connection according to the first embodiment of the present invention.

FIG. 1 is a side cross sectional view of a stacked radio-frequency module taken along A–A' line in FIG. 2. FIG. 2 is a front view of a first dielectric multi-layer substrate 1a which is located at the lower-most stage. FIG. 3 is a front view of a second dielectric multi-layer substrate 1b which is located at the intermediate stage. FIG. 4 is a front view of a third dielectric multi-layer substrate 1c which is located at the upper-most stage. FIG. 5 is a bottom view of the dielectric multi-layer substrate 1b. FIG. 6 is a bottom view of the dielectric multi-layer substrate 1c, which forms the top surface of the stacked radio-frequency module. FIG. 7 is a side cross sectional view of the stacked radio-frequency module taken along B–B' line of FIG. 2. FIG. 8 is an enlarged view showing the important sections of the junction between the dielectric multi-layer substrates created by gold bumps. The structure of the first embodiment will now be described referring to the drawings.

The dielectric multi-layer substrate (hereinafter also referred to as a "package") 1a has a shape so that MMICs 9 can be stored inside. In other words, the rectangular package 1a has a shape wherein dielectric walls are placed at the periphery of the substrate so that, in the package 1a, a cavity (closed space) is formed surrounded by the walls of the package 1a and the bottom surface of the package 1b which is to be placed on top of the package 1a. Inside the walls, a step is formed as a mounting surface 17a for a metal sealing lid. A metal sealing lid 12 is placed on the step to air-tightly seal MMICs 9c and 9d. A ground potential surface 11a, DC/CONT pads 4h, 4i, and wire bonding surfaces 16a for radio-frequency signals and power supply/control signals are sealed with the MMICs 9c and 9d. The connection relationship between wires 13 and MMICs 9c and 9d will be clarified later in the description.

The package 1b to be stacked is supported by the top surfaces of the walls of package 1a. At the top surfaces of the walls, RF pads 2i and 2n, grounds pads 3i and 3j, and DC/CONT pads 4g are provided. Each of the pads 2, 3, and 4 is connected to the MMICs 9c and 9d via vertical feed wiring paths 5d and 5e for radio-frequency signals (hereinafter referred to as "vertical feed line"), a via hole 7d, strip wiring paths 8a and 8b, and a wiring path 10e for control signals, all of which are provided inside the package 1a. The connection relationship will be clarified in more detail in the description below. Furthermore, a plurality of via holes 7g are provided below the MMIC 9d of the package 1a as the countermeasure for radiation for cases when a heat generating element such as HPA is incorporated in the MMICs 9. Large-capacity stacked ceramic capacitors 18 are mounted at the bottom surface of the stacked package 1b so that the capacitors 18 are provided within the cavity of the package 1a.

The package 1b has a structure similar to that of the package 1a. In package 1a, no structure, such as a pad, for connection to the packages at the lower stage is provided on the bottom surface, because the package 1a is the lower-most stage of the stacked module. The package 1b, on the other hand, is located at the intermediate stage, and therefore, structures for connection to the upper stage and to the lower stage are provided respectively on the top and bottom surfaces of the package 1b. For example, at the bottom surface of the package 1b, pads 2, 3, and 4 having similar structure as the pads 2, 3, and 4 provided at the top surfaces of the walls of the package 1a are provided at positions opposing the pads 2, 3, and 4 of package 1a. For example, referring to FIGS. 2 and 5, an RF pad 2o is provided at a position opposing the RF pad 2n and an RF pad 2h is provided at a position opposing the RF pad 2i. Other connection relationships will be clarified in the description below.

In addition, on the bottom surface of the package 1b, stacked ceramic capacitors 18 are mounted as described above. On the packages 1a and 1b, wiring paths for connecting the stacked ceramic capacitors 18 to the MMICs 9c and 9d are provided. The connection of these wiring paths will also be described later.

The package 1c forming the upper-most stage of the stacked module is turned upside down and placed on the package 1b onto which MMICs 9 are mounted. A cavity (closed space) of the package 1b is formed by and surrounded by the walls of the package 1b and the front surface of the package 1c. A control circuit 15 for setting power supply/control signals of the MMICs 9 is stored on the package 1c within the cavity. Here, the step for providing amounting surface for a metal sealing lid is not provided on the package 1c, and the package 1c has a structure wherein a metal sealing lid 12c is fixed on the front surface to seal the control circuit 15. In the package 1c according to the first embodiment, pads 2, 3, and 4 similar to the pads 2, 3, and 4 provided on the walls of the package 1b which is the adjacent lower stage are provided at positions opposing the pads 2, 3, and 4 on the walls of the package 1b. For example, referring to FIGS. 3 and 4, an RF pad 2b is provided at a position opposing an RF pad 2c and an RF pad 2q is provided at a position opposing an RF pad 2p. A vertical feed line 5a or the like for connecting the pads 2, 3, and 4 and the control circuit 15 are provided inside the package 1c. The connection relationship will be clarified in the description of the operations.

The stacked module according to the first embodiment is formed by stacking the packages 1a, 1b, and 1c. Except for the external input/output pads, the pads 2, 3, and 4 are provided at positions that oppose each other. One characteristic of the first embodiment is that the corresponding pads 2, 3, and 4 are connected via a gold bump 6. The RF pads 2 which are the input and output ends of the vertical feed lines 5 provided in each of the packages 1 are joined by the gold bumps 6 so that the same vertical feed wiring path penetrates through the different packages. The other wiring paths are similar to the vertical feed lines 5. The gold bumps 6 maintains the relative positional relationships among the packages 1a, 1b, and 1c through the joining force. The gold bumps 6e, 6i, and 6j which are not used for signal transmission are dummy bumps for securing the packages.

The operation of the device according to the first embodiment will now be described.

Radio-frequency signals input from an RF pad 2a of the package 1c are transmitted through a vertical feed line 5a formed by a via hole to an RF pad 2b, where the radio-frequency signals are transmitted to an RF pad 2c via a gold bump 6a formed between the packages 1b and 1c. Then, the radio-frequency signals are transmitted through a vertical feed line 5b within the package 1b, via a strip wiring path 8a, and to the wire bonding surface 16b of the package 1b. From there, the radio-frequency signals are transmitted through a wire 13a, via an RF pad 2d, and to an MMIC 9a. The radio-frequency signals are subjected to modulation in the amplitude, phase, or distribution, such as, for example, amplification at the MMIC 9a and then transmitted through an RF pad 2e, a wire 13b, and an RF pad 2f to an MMIC 9b. The radio-frequency signals are then subjected to another modulation by the MMIC 9b and then transmitted through an RF pad 2g, a wire 13c, a strip wiring path 8b, and a vertical feed line 5c to an RF pad 2h. Next, the radio-frequency signals are input to the package 1a via an RF pad 2i connected by a gold bump 6b, and transmitted through a vertical feed line 5d, a strip wiring path 8c, a wire 13d, and an RF pad 2j on an MMIC 9c, to an MMIC 9c. After being subjected to modulation at the MMIC 9c, the radio-frequency signals output from the MMIC 9c are transmitted via an RF pad 2k, a wire 13e, and an RF pad 2l, to an MMIC 9d, where, after being subjected to modulation at the MMIC 9d, the radio-frequency signals are transmitted through an RF pad 2m, a wire 13f, a strip wiring path 8d, and further, through a vertical feed line 5e, an RF pad 2n, a gold bump 6c, an RF pad 2o, a vertical feed line 5f, an RF pad 2p, a gold bump 6d, an RF pad 2q, and a vertical feed line 5g, and output from an RF pad 2r.

As shown in FIG. 8, the vertical feed lines have a structure such that a-via hole for the radio-frequency signals is provided at the center and ground via holes are provided to surround the via hole for radio-frequency signals. Each of the signal via holes respectively corresponding to the vertical feed line 5a passing through the package 1c and to the vertical feed line 5b passing through the package 1b are joined by a gold bump 6a and the ground via holes are joined by gold bumps 6f. With such a configuration, the ground potential surface 11a of the package 1a has the same potential as the ground pad 3b through vertical feed lines 5e, 5f, and 5g, and, similarly, the ground potential surface 11b has the same potential as the ground pad 3a through the vertical feed lines 5a and 5b.

On the other hand, power supply/control signals are input from a DC/CONT pad 4a, and are transmitted via a via hole 7a within the package 1c, through a DC/CONT pad 4b, a wire 13g, and a DC/CONT pad 4c, to the control circuit 15. The outputs from the control circuit 15 are transmitted through a DC/CONT pad 4d, a wire 13h, and a DC/CONT pad 4e, via a wiring path 10a for control signals and a via hole 7b as shown in FIG. 7, to DC/CONT pads 4f. There, the power supply/control signals are input via a gold bump 6g to DC/CONT pads 4k of the package 1b, and are transmitted through a via hole 7c and a wiring path 10b for control signals, to wiring paths 10c and 10d for control signals. The power supply/control signals input to the wiring path 10c for control signals are supplied via a wire 13i and a DC/CONT pad 4m to the MMIC 9a. Similarly, the power supply/control signals input to the wiring path 10d for control signals are supplied via a wire 13j and a DC/CONT pad 4l to the MMIC 9b.

At the same time, the power supply/control signals input to the package 1b are transmitted through a via hole 7c, a DC/CONT pad 4j, a gold bump 6h, a DC/CONT pad 4g, a via hole 7d, and a wiring path 10e for control signals, to wiring paths 10f and log for control signals. The power supply/control signals input to the wiring path 10f for control signals are supplied via a wire 13k and a DC/CONT pad 4h to the MMIC 9c. Similarly, the power supply/control signals input to the wiring path 10g for control signals are supplied via a wire 13l and a DC/CONT pad 4i to the MMIC 9d.

Here, one end (power supply terminal) of the stacked ceramic capacitor 18 is connected to a mount pad 19a for a stacked ceramic capacitor, a via hole 7e, and a wiring path 10h for control signals. The power supply terminals of the stacked ceramic capacitors 18 are connected respectively to the MMICs 9c and 9d in the package 1a from the wiring path 10h for control signals, through the via hole 7c, the gold bump 6h, the via hole 7d, wiring path 10e for control signals, and each of the wiring paths 10f and 10g for control signals. The power supply terminals of the stacked ceramic capacitors 18 are also respectively connected to the MMICs 9a and 9b in the package 1b from the wiring path 10h for control signals, through the via hole 7c, the wiring path 10b for control signals, and each of the wiring paths 10c and 10d for control signals. One end (ground terminal) of each of the plurality of stacked ceramic capacitors 18 is connected to the ground potential surface 11b within the package 1b through a mount pad 19b for stacked ceramic capacitor, a via hole 7f, and wiring path 10i for control signals.

In the first embodiment, with the above described structure, radio-frequency signals and power supply/control signals respectively input from an external terminal can be supplied to each of the MMICs 9.

According to the first embodiment, because gold bumps which have a small frequency characteristic are used for connection between the vertical feed wiring paths of the packages 1, a compact, multi-functional module can be formed which can operate at radio-frequencies. Because the joining surface by the gold bumps 6 is provided at opposing end surfaces of two packages, there is no need for partially machining the substrate for signal connection, for example, and thus, the productivity of the packages can be improved. By using gold bumps, the parasitic inductance component caused by the connection can be reduced. Also, because the structure is such that one vertical feed wiring path penetrates through different dielectric multi-layer substrates, it is possible to realize signal transmission between the dielectric multi-layer substrates with wide bandwidth and small loss. Moreover, because it is possible to secure distances between the metal sealing lid 12a and the MMICs 9a and 9b, or between the metal sealing lid 12b and the MMICs 9c and 9d by simply adjusting the height of the walls formed in the packages 1a and 1b, respectively, it is possible to design the MMICs 9a~9d with small variation in the characteristics. Furthermore, in the first embodiment, the stacked radio-frequency module is constructed so that individual mount surfaces 17a, 17b, and 17c for a metal sealing lid are provided respectively in the packages 1a, 1b, and 1c in order to allow individual air-tight sealing by the metal sealing lids 12a, 12b, and 12c. Because of this, it is possible to prevent leakage, to the outside, of radiation signals from the connections between the MMICs and bonding wires. In this manner, it is possible to prevent radiation signals from causing erroneous operations. In addition, according to the first embodiment, by providing the cavity for storing the MMICs 9a and 9b in a separate package from the package to which the cavity for storing the MMICs 9c and 9d is provided, each of the MMICs 9 is spatially and completely separated. Because no electromagnetic bonding or the like is used for signal transmission, the electrical isolation between the MMICs can be enlarged.

Furthermore, because common via holes in multi-layer packages are used for the vertical feed wiring paths, the vertical feed wiring paths 5 can be formed at low cost. Also, because the signal wiring paths for radio-frequency signals and for power supply/control signals formed in each of the packages 1 are connected by bumps, a plurality of signal line connections can be collectively formed, allowing for manufacture of the module at low cost.

In addition, because gold bumps 6 are used for signal connection, a gold—gold joining force can be used also as the maintaining force between the packages. Also, because the connecting section is no longer exposed, ease for handling at the module manufacturing process and electrical characteristic evaluation process can be improved.

In general, when the stacked radio-frequency module includes an amplifier such as, for example, an LNA (Low Noise Amplifier) and an HPA (High Power Amplifier), as a radio-frequency circuit element, a large-capacity capacitor must be equipped near the module for improving the stability at low frequencies. Also, when the module is to be pulse driven, in order to increase the rise speed of a pulse waveform, a large-capacitance capacitor for supplying charges may sometimes be necessary near the module. In consideration of these problems, in the first embodiment, capacitors 18 are mounted at the bottom surface of the package 1b and the capacitors 18 and MMICs 9 are connected through very short via holes 7 and wiring paths 10 for control signals. In this manner, the above problems can be solved and the inductance caused by the connection wiring paths can be reduced. Because the capacitors 18 are stored inside a cavity formed by the side walls of the package 1a and the bottom surface of the package 1b, the width of the module need not be increased and reduction in the size of the module can be realized including the mounting region for the capacitors, which have conventionally been equipped external to the module.

Moreover, according to the first embodiment, the control circuit 15 (various digital/analog driver ICs) necessary for calculating and converting the control signals to be supplied to the MMICs 9 is stored in the package 1c. Because of this, a compact, multi-functional module including the drivers can be produced. Also, because it is possible to include the control circuit 15 within the module, the number of power supply/control signal pads to be added to the module can be reduced, and therefore, the problems when the module according to the embodiment is further mounted onto a feeding circuit or the like can be reduced.

In the first embodiment, a plurality of via holes 7g are placed below the MMIC 9d. These via holes 7g function as a countermeasure for radiation when the MMICs 9 include a heat generating element such as an HPA. Also, because the input/output of the signals is provided at the upper-most surface of the package 1c, when the heat generating element such as the HPA is mounted in the first stage, the radiation area can be increased.

Here, the gold—gold joining force of gold bumps are used for fixation between the packages. The fixture strength can be increased by applying a fixing material such as, for example, an adhesive, externally on the package at the package interfaces (for example, between the packages 1a and 1b). In the first embodiment, gold bumps are used. By using solders for the bumps, the package fixture strength between the first and second stages can be increased. In the first embodiment, MMICs are the only circuits mounted, but the above structure can also be applied to, for example, active HMIC elements and passive radio-frequency circuits such as circuits with a resistor which is difficult to form in packages. In the first embodiment, the connection between the elements such as the MMICs are realized by wires, but the connection can also be realized by flip chip connection by bumps. This is also true for the subsequent embodiments.

In the first embodiment, the input/output surface for the radio-frequency signals and for the power supply/control signals are provided at the upper-most surface of the package 1c. It is also possible to provide the input/output surface at the bottom surface of the package 1a. In this manner, when an element in which the reduction in loss is a priority is equipped in the package 1a, the loss due to the vertical feed line, the strip wiring paths, and etc., from the output of the element to the output of the module can be reduced, and thus, higher performance can be achieved.

Embodiment 2

Figure 9:
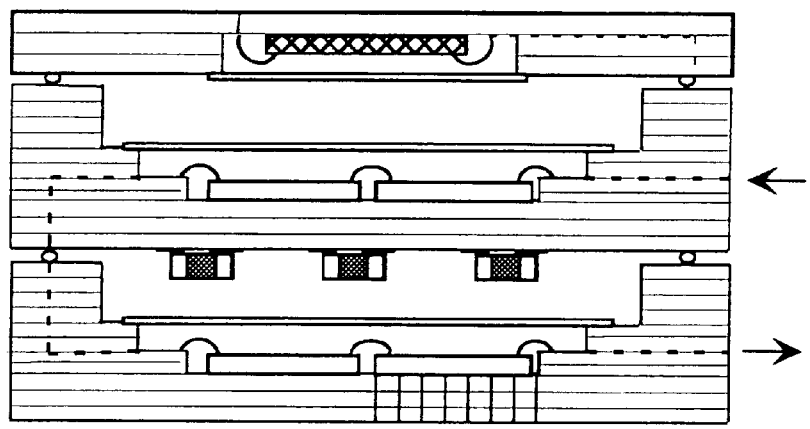
FIG. 9 is aside cross sectional view showing a second embodiment of a stacked radio-frequency module according to the present invention.
Figure 10:
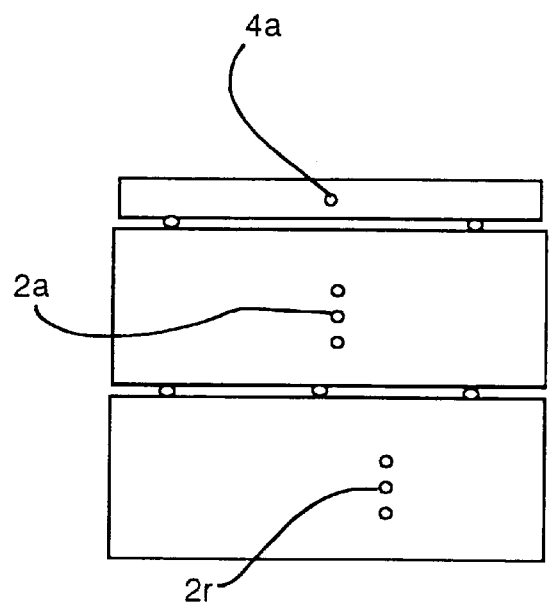
FIG. 10 is a side view seen from a position where the external input/output pads can be viewed.

FIG. 9 is a side cross sectional view of a stacked radio-frequency module according to a second embodiment of the present invention. FIG. 10 is a side view of the stacked radio-frequency module according to the second embodiment viewed from a position where the external input pad can be seen. In the second embodiment, by providing each of the external input/output pads 2a, 2r, and 4a for radio-frequency signals and for power supply/control signals at the side surface of the module, an area for radiation can be secured when a heat generating element such as an HPA is mounted in the first stage, and, at the same time, the length of wiring paths passing through the multi-layer substrates such as the vertical feed lines and strip wiring paths from the module input/output pad to the MMICs can be shortened. This minimizes the loss resulting from signal propagation. The second embodiment is particularly effective in a module in which the loss between the MMICs and terminals is important or in a module having an HPA which requires an area for radiation. The other structures and operations in the second embodiment are identical to those in the first embodiment and will not described again.

Embodiment 3

Figure 11:
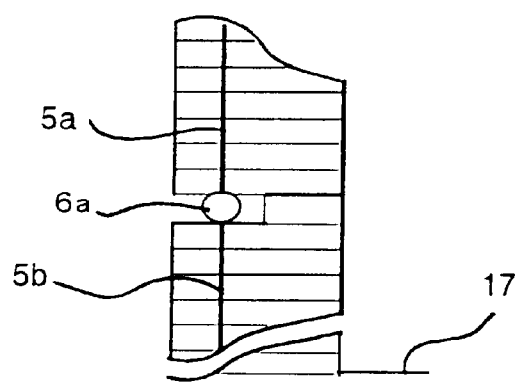
FIG. 11 is an enlarged view showing important sections of the bump connection in a third embodiment of a stacked radio-frequency module according to the present invention.

FIG. 11 is an enlarged view of a gold bump connection in a stacked radio-frequency module according to a third embodiment. The dielectric multi-layer substrates 1 are formed by layering dielectrics. In the structure shown in FIG. 11, portions near the ends of the dielectric layer forming the top surface of the package 1b is partially removed. More specifically, the portion where the RF pad 2c corresponding to the vertical feed line 5b is to be provided is removed. The RF pad 2c is formed on the surface that is exposed by such removal, that is, on the second dielectric layer. A gold bump 6a is mounted in the space created between the packages 1b and 1c by the removal.

According to the third embodiment, by forming the joining section by the gold bumps 6 as the structure of removal as described above, it is possible to prevent degradation of the characteristics of the module due to excessive collapse of the gold bumps when weight is applied when joining the bumps between the packages 1a and 1b. Also, because the top surface of the package 1b and the front surface of the package 1c can contact each other, the amount of radiation from the radio-frequency signals from the bump connection can be reduced, and erroneous operations of the module can be more reliably prevented. Other structures and operations in the third embodiment are identical to those in the first embodiment, and will not be described again.

In the above explanation, the joining surface between the packages 1b and 1c, joined by the gold bump 6a is exemplified, but the same machining process can be applied to the other joining surfaces.

Embodiment 4

Figure 12:
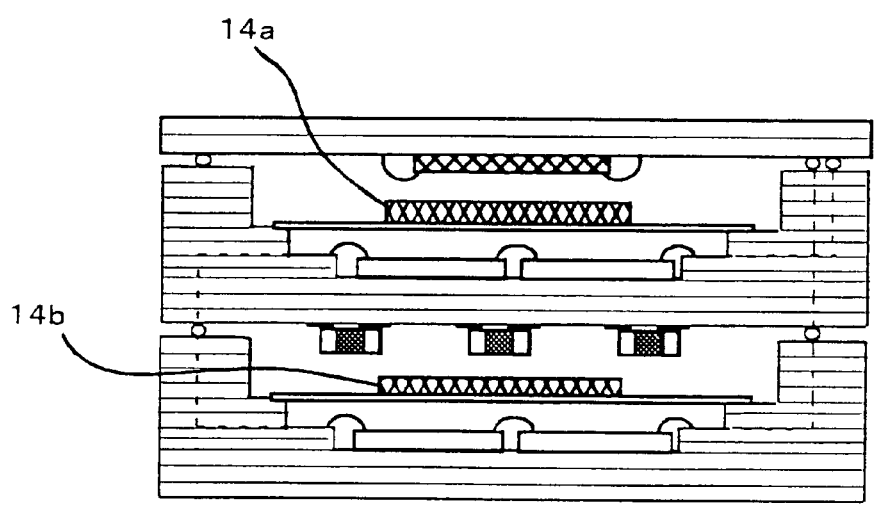
FIG. 12 is a side cross sectional view showing a fourth embodiment of a stacked radio-frequency module according to the present invention.
Figure 13:
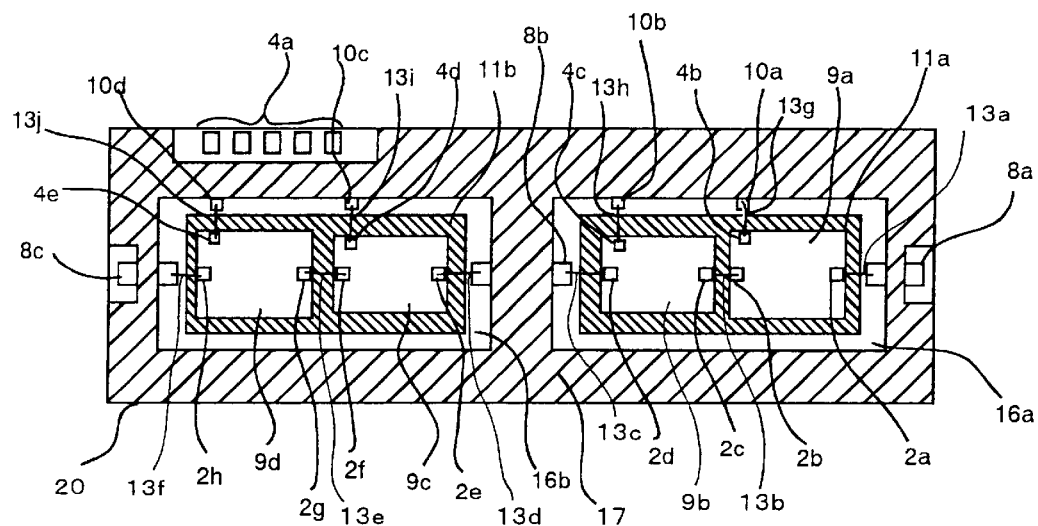
FIG. 13 is a front view of a conventional radio-frequency module.
Figure 14:
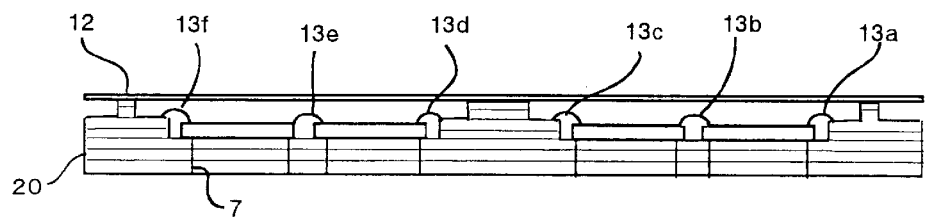
FIG. 14 is a side cross sectional view of FIG. 13.
Figure 15:
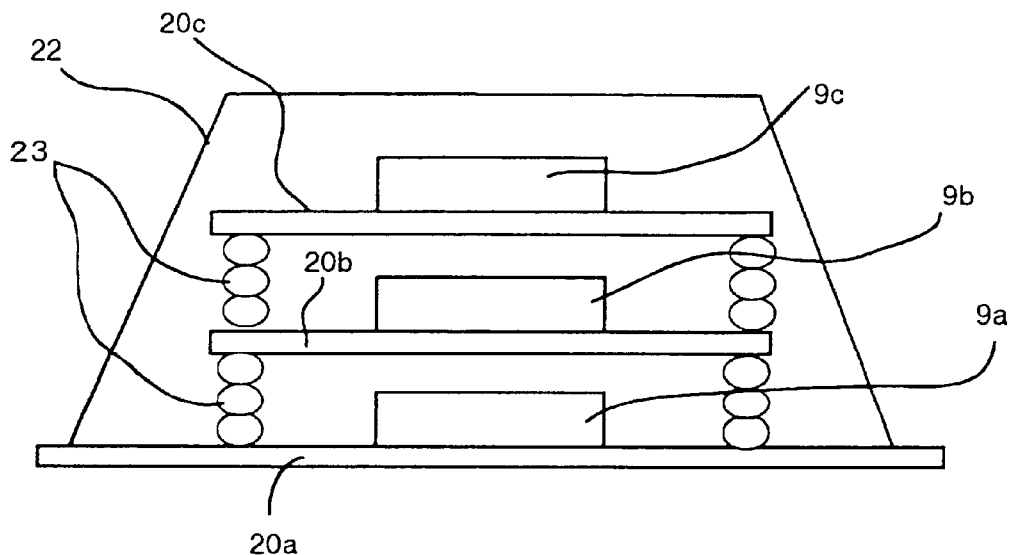
FIG. 15 is aside cross sectional view of a conventional stacked radio-frequency module.
Figure 16:
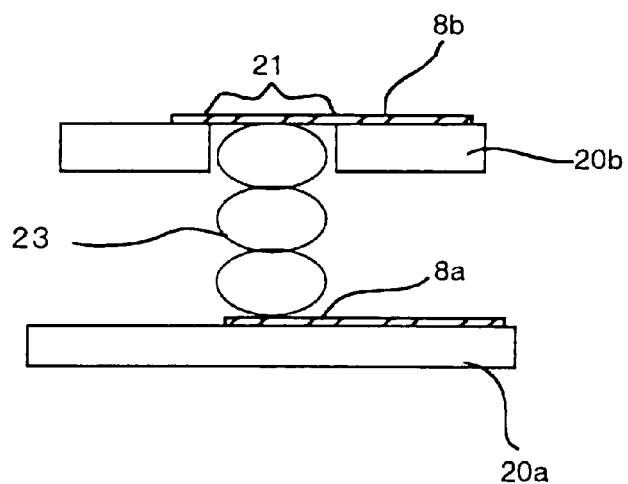
FIG. 16 is a side enlarged view of a bump section in a conventional stacked radio-frequency module.

FIG. 12 is a side cross sectional view showing a fourth embodiment of a stacked radio-frequency module according to the present invention. The fourth embodiment has a structure in which an electromagnetic wave absorber 14 is added to the structure of the first embodiment.

The operations of the fourth embodiment will now be described only where the operations differ from those in the first embodiment. In the configuration of the fourth embodiment, above the metal sealing lid 12a of the package 1a, a cavity is formed by the side walls inside the package 1a and the bottom surface of the package 1b. Similarly, above the sealing lid 12b of the package 1b, another cavity is formed by the side walls inside the package 1b and the bottom surface of the package 1c. Here, if the operation frequency of the module becomes higher so that the width (w) of the cavity is sufficiently large compared to the wavelength ($\lambda$), e.g. W is comparable to $\frac{1}{2}\lambda$, attenuation of the electric waves leaked into and propagating through the cavity is decreased. As a result, a problem may occur in that the electrical isolation between the gold bumps 6b and 6c and the electrical isolation between the gold bumps 6a and 6d are reduced. Further, when the amplitude difference of the signals is large between the gold bumps 6b and 6c and/or between the gold bumps 6a and 6d, problems may be created, depending on the MMICs 9 (amplifiers, attenuators, or the like) stored in the packages 1a and 1b, such as generation of ripples in the frequency characteristic of the module or unnecessary oscillation, in addition to the reduction in the isolation as described above.

To prevent this problem, in the fourth embodiment, electric wave absorbers 14a and 14b are provided respectively inside the cavities in consideration of such problems, and respectively allow improvements in isolation between the gold bumps 6b and 6c and in isolation between the gold bumps 6a and 6d.

What is claimed is:

1. A stacked radio-frequency module formed by stacking dielectric multi-layer substrates onto which radio-frequency circuits are provided, wherein, at least two of the dielectric multi-layer substrates comprise:

a substrate having dielectric walls provided on its periphery;

a closed space in which the radio-frequency circuits are stored, formed by surrounding the space with the dielectric walls and the dielectric multi-layer substrate provided as an upper stage;

an input/output terminal for radio-frequency signals provided on at least one of the upper surfaces of the dielectric walls and the bottom surface of the substrate at a position where the dielectric walls are provided, at a position opposing an input/output terminal for radio-frequency signals of the dielectric multi-layer substrate at the upper stage or lower stage;

an input/output terminal for power supply/control signals provided on at least one of the upper surfaces of the dielectric walls and the bottom surface of the substrate at a position where the dielectric walls are provided, at a position opposing an input/output terminal for power supply/control signals of the dielectric multi-layer substrate at the upper stage or lower stage;

a transmission path within the substrate for radio-frequency signals provided inside the dielectric multi-layer substrate, for connecting the input/output terminal for radio-frequency signals and the radio-frequency circuits; and a transmission path within the substrate for power supply/control signals provided inside the dielectric multi-layer substrate, for connecting the input/output terminal for power supply/control signals and the radio-frequency circuits, and gold bumps provided for joining the input/output terminals for radio-frequency signals that are provided at opposing positions and for joining the input/output terminals for power supply/control signals provided at opposing positions.

2. A stacked radio-frequency module according to claim 1, further comprising a dielectric multi-layer substrate for storing a control circuit for setting power supply/control signals for the radio frequency circuits.

3. A stacked radio-frequency module according to claim 1, wherein a sealing lid for sealing the circuits is provided in the closed space.

4. A stacked radio-frequency module according to claim 1, wherein a large-capacitance capacitor is provided on the bottom surface of the dielectric multi-layer substrate forming the closed space.

5. A stacked radio-frequency module according to claim 1, wherein at least one of an external input/output terminal for radio-frequency signals and an external input/output terminal for power supply/control signals is provided on a side surface of a dielectric wall of the dielectric multi-layer substrate.

6. A stacked radio-frequency module according to claim 1, wherein the input/output terminal for radio-frequency signals and the input/output terminal for power supply/control signals are provided on a surface created by partially removing at least one layer which forms the dielectric multi-layer substrate.

7. A stacked radio-frequency module according to claim 1, wherein an electric wave absorber is provided in the closed space.

8. A stacked radio-frequency module according to claim 2, wherein a sealing lid for sealing the circuit is provided within the closed space.

* * * * *